(12) United States Patent
Yatsuo et al.

(10) Patent No.: US 8,003,991 B2
(45) Date of Patent: Aug. 23, 2011

(54) SILICON CARBIDE MOS FIELD EFFECT TRANSISTOR WITH BUILT-IN SCHOTTKY DIODE AND METHOD FOR FABRICATION THEREOF

(75) Inventors: Tsutomu Yatsuo, Tsukuba (JP); Shinsuke Harada, Tsukuba (JP); Kenji Fukuda, Tsukuba (JP); Mitsuo Okamoto, Tsukuba (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 12/281,391

(22) PCT Filed: Dec. 27, 2006

(86) PCT No.: PCT/JP2006/326072
§ 371 (c)(1),
(2), (4) Date: Oct. 21, 2008

(87) PCT Pub. No.: WO2007/099688
PCT Pub. Date: Sep. 7, 2007

(65) Prior Publication Data
US 2009/0173949 A1    Jul. 9, 2009

(30) Foreign Application Priority Data

Mar. 2, 2006    (JP) .................................. 2006-055868

(51) Int. Cl.
*H01L 29/15*    (2006.01)
(52) U.S. Cl. .................. 257/77; 257/328; 257/E29.104
(58) Field of Classification Search .................. 257/77, 257/264, 328, E29.104
See application file for complete search history.

(56) References Cited

U.S. PATENT DOCUMENTS

| | | | | |
|---|---|---|---|---|
| 3,617,824 A | * | 11/1971 | Shinoda et al. | 257/407 |
| 2005/0077591 A1 | * | 4/2005 | Fukuda et al. | 257/500 |
| 2005/0133794 A1 | * | 6/2005 | Hayashi et al. | 257/77 |
| 2005/0280004 A1 | * | 12/2005 | Das et al. | 257/77 |
| 2006/0057796 A1 | * | 3/2006 | Harada et al. | 438/199 |

FOREIGN PATENT DOCUMENTS

| | | |
|---|---|---|
| JP | 6-318678 | 11/1994 |
| JP | 10-136642 | 5/1998 |
| JP | 2002-203967 | 7/2002 |
| JP | 2005-183563 | 7/2005 |
| WO | WO 2004/036655 A1 | 4/2004 |

* cited by examiner

*Primary Examiner* — Lex Malsawma
*Assistant Examiner* — Robert Huber
(74) *Attorney, Agent, or Firm* — Oblon, Spivak, McClelland, Maier & Neustadt, L.L.P.

(57) ABSTRACT

This invention has a cell incorporating a built-in Schottky diode region disposed in at least part of an elementary cell that constitutes an SiC vertical MOSFET provided in a low-density p-type deposit film with a channel region and a base region inverted to an n-type by ion implantation. This built-in Schottky diode region has built therein a Schottky diode of low on-resistance that is formed of a second deficient pan disposed in a high-density gate layer, a second n-type base layer penetrating a low-density p-type deposit layer formed thereon, reaching an n-type drift layer of the second deficient part and attaining its own formation in consequence of inversion of the p-type deposit layer into an n-type by the ion implantation of an n-type impurity from the surface, and a source electrode connected in the manner of forming a Schottky barrier to the surface-exposed part of the second n-type base layer.

11 Claims, 6 Drawing Sheets

(a)

(b)

(c)

(d)

(e)

(f)

US 8,003,991 B2

SILICON CARBIDE MOS FIELD EFFECT TRANSISTOR WITH BUILT-IN SCHOTTKY DIODE AND METHOD FOR FABRICATION THEREOF

TECHNICAL FIELD

This invention relates to a silicon carbide MOS field effect transistor having built therein a vertical MOSFET and Schottky diode exhibiting low on-resistance and high voltage and using silicon carbide as raw material and a method for the fabrication thereof.

BACKGROUND ART

The single crystal of silicon carbide (SiC), as compared with the single crystal of silicon (Si), possesses excellent physical properties such as a wide band gap, large dielectric breakdown strength and a large saturated drift velocity of electrons. By using SiC as a starting material, therefore, it is made feasible to fabricate a semiconductor device for electric power exhibiting high blocking voltage and low resistance and surpassing the limits of Si. Further, SiC is characterized, similarly to Si, by being capable of forming an insulating layer by thermal oxidation. From these facts, it is inferred that a vertical MOSFET of high blocking voltage and low on-resistance is realized by using a single crystal of SiC as a material. Thus, many researches and developments directed toward this realization are now under way.

When SiC is used as raw material, a vertical MOSFET cannot be fabricated by the double diffusion method that is generally adopted for Si. This is because no channel region can be formed by the difference in diffusion length in the lateral direction between a p and an n type impurity because of an extremely small diffusion coefficient of an impurity element within the single crystal of SiC. A -vertical MOSFET analogous to the D-MOSFET of Si, therefore, is prepared by the ion implantation of a p and an n type impurity. By this method, however, the electron mobility is degraded because numerous crystal defects induced by the ion implantation are left behind in the channel region and suffered to scatter the conduction electrons induced within the channel. The SiC vertical MOSFET prepared by the double ion implantation method has an extremely small channel mobility of not more than 5 cm$^2$/Vs as compared with that of the D-MOSFET of Si, which is about 500 cm$^2$/Vs. As a result, it encounters the problem that the on-resistance thereof will be far higher than the theoretical value.

As a means to solve this problem, the structure that has a channel region formed not by ion implantation but with a deposit film has been proposed, A typical example of this structure is disclosed in Patent Document 1. FIG. 8 is a cross section of a unit cell thereof. In this structure, a low-density n-type SiC drift layer 2 is deposited on a high-density n-type SiC substrate 1, a high-density p-type SiC gate layer 3 possessing a first deficient part 21 is formed by ion implantation on the surface of the n-type drift layer 2, and a low-density p-type SiC layer 5 is further deposited thereon. On the surface part of the low-density p-type layer 5, an n-type source layer 4 is selectively formed by ion implantation, a gate electrode 10 is formed via a gate oxide film 7, a source electrode 9 is further formed via an interlayer insulating film 11, respectively, and a channel region 51 is formed in a low-density p-type deposit layer 5 lying directly below the gate oxide film 10. The structure is characterized by the fact that an n-type base layer 61 penetrating the low-density p-type deposit layer 5 and reaching the n-type drift layer 2 of the first deficient part 21 is caused by the ion implantation of an n-type impurity via the surface thereof to selectively form a region having the p-type deposit layer inverted to an n-type (hereinafter, this n-type base layer 61 will be referred to as "ion-implantation polarity-inversion layer"). In this structure, since the channel region 51 is formed in the low-density p-type deposit layer having undergone no ion implantation, it is enabled to obtain high mobility of conduction electrons and fabricate a vertical MOSFET of small on-resistance. The structure is characterized by the fact that in the state of stopping potential, the leak of electric field as to the gate oxide film near the channel region 51 can be prevented and the source and drain blocking voltage can be heightened because the vertical channel part 21 is completely pinched off at low voltage with the depletion layer diverging in the lateral direction from the high-density p-type gate layer 3 toward the low-density n-type drift layer 2.

In the MOSFET of this conventional structure, the region that is composed of the source electrode 9, a part 52 of the low-density p-type deposit layer 5 connected with low resistance to the source electrode, the p-type gate layer 3 projected in the direction of the thickness thereof, the n-type drift layer 2, the high-density n-type substrate 1 and a drain electrode 8 is made to form a diode region to be built in the MOSFET.

When the MOSFET of this description is used in the inverter device with such a dielectric load as an electric motor, the return current generated by the energy accumulated in the load is conducted to the built-in diode region. At times dependent on the mode of operation, the possibility that the magnitude of the electric current conducted to the diode will equal that of MOSFET and that the operating commitment of current conduction will exceed 50% of its total may arise. The MOSFET that is used in an inverter device having high conversion efficiency, therefore, is required to incur the least possible loss of current conduction in the built-in diode region.

The conventional MOSFET disclosed in FIG. 8 and using SiC as raw material, however, has the problem of increasing the forward voltage drop in a built-in diode region. That is, the p-n junction diode of SiC having a wide band gap, for the purpose of conducting electric current in the forward direction, necessitates a forward bias exceeding a blocking-state voltage of not less than 2.5 V to 3.0 V and consequently notably increases the forward voltage drop as compared with a MOFET using Si as raw material.

Patent Document 1: International Publication 2004-036655

DISCLOSURE OF THE INVENTION

Problem to be Solved by the Invention

The SiC vertical MOSFET of a structure having a channel region formed of a p-type deposit film of low-density has been proposed as a low-loss MOSFET that has the on-resistance lowered by the improvement of channel mobility. The diode region that is built in the SiC vertical MOSFET of such a structure as proposed conventionally, however, incurs a large forward voltage drop while electric current flows therein because it is in the structure of a p-n junction diode. For this reason, when it is used as a reflux diode for an electric power conversion system, it encounters the problem that the power loss of the whole device will increase and the characteristics of the SiC vertical MOSFET exhibiting small on-resistance and low loss will be impaired.

This invention, in view of these problems, has an object of providing a structure that decreases the loss occurring in the built-in diode of an SiC vertical MOSFET possessing a channel region formed with a low-density p-type deposit layer and exhibiting low on-resistance and high blocking voltage.

Another object of this invention resides in providing a structure that uses as a Schottky diode incurring low forward voltage drop the built-in diode of an SiC vertical MOSFET possessing a channel region formed of a low-density p-type deposit layer and exhibiting low on-resistance and high blocking voltage.

Still another object of this invention resides in providing a method for preparing an SiC vertical MOSFET that possesses a channel region formed of a low-density p-type deposit layer having built therein a Schottky diode incurring low forward voltage drop and exhibits low on-resistance and high blocking voltage.

Means to Solve the Problem

This invention, for the purpose of solving the problems mentioned above, is directed to an SiC vertical MOSFET comprising a low-density p-type deposit layer; a channel region of low-density formed in the low-density p-type deposit layer, and a component element cell having at least part thereof provided with a built-in Schottky diode region; wherein the built-in Schottky diode region includes a high-density gate layer; a second deficient pant disposed in the high-density gate layer and provided with an n-type drift layer; a low-density p-type deposit layer formed on the second deficient part; a second n-type base layer penetrating the low-density p-type deposit layer, reaching the n-type drift layer of the second deficient part and attaining its own formation in consequence of inversion of the p-type deposit layer into an n-type by ion implantation of an n-type impurity from a surface of the p-type deposit layer; and a source electrode connected in a manner of forming a Schottky barrier to a surface-exposed part of the n-type base layer.

The SiC vertical MOSFET of the above structure is characterized by having interposed between the second n-type base layer and the source electrode a Schottky barrier metal differing in material from the source electrode.

The SiC vertical MOSFET of the above structure is characterized by having the second n-type base layer provided in the surface part thereof with a high density layer equaling the n-type base layer in electrical conductivity.

The SiC vertical MOSFET of the above structure is characterized by the fact that the width of the second deficient part of the high-density gate layer of the built-in Schottky diode region approximately equals the width of the first deficient part of the high-density gate layer.

The SiC vertical MOSFET of the above structure is characterized by having the cell thereof constitute part of the component elements thereof.

The SiC vertical MOSFET of the above structure is characterized by having a cell formed of the built-in Schottky diode region constitute part of the component elements thereof.

The method for preparing the SiC vertical MOSFET so structured as described above comprises partially forming on an n-type drift layer a high-density p-type layer possessing the first and second deficient parts, forming a low-density p-type deposit film on both the high density p-type layer and the n-type drift layer exposed in the first and second deficient parts, and further implementing ion implantation of an n-type impurity of slightly high density selectively till the low-density p-type deposit film is penetrated and the n-type drift layer is reached in the neighborhood of the partially deficient parts projected in the direction of thickness and the regions encompassing the neighborhood, thereby forming a first and a second n-type base region by attaining inversion of the part of the low-density p-type deposit film.

Effects of the Invention

This invention structured as described above exhibits the following effects.

The inventions set forth in claim 1 through claim 4 enable realization of an SiC vertical MOSFET having built therein a Schottky diode of low on-resistance by causing a low-density p-type deposit layer to form and possess therein a channel region of low density, forming a first base region of a MOSFET region inverted to an n-type by ion implantation in conjunction with a second base region inverted to an n-type similarly by ion implantation, and having a built-in Schottky diode region disposed therein.

The invention set forth in claim 5 realizes addition to voltage by virtue of the pinch-off effect in the deficient part of the high-density gate layer.

The inventions set forth in claims 6 and 7 succeed in further decreasing the on-resistance of the built-in Schottky diode.

The inventions set forth in claims 9 and 10 enable easy preparation of an SiC vertical MOSFET of the type having built therein a Schottky diode exhibiting high blocking voltage and low on-resistance.

The inventions set forth in 8 and 11 enable realization of elementary properties fit for use in an applied circuit because the sea occupied by the built-in diode in a semiconductor device can be freely adjusted.

The invention set forth in claim 12 enables realization of an SiC vertical MOSFET exhibiting small resistance and high blocking voltage during the existence of on state.

EXPLANATION OF REFERENCE NUMERALS

Figure 1:
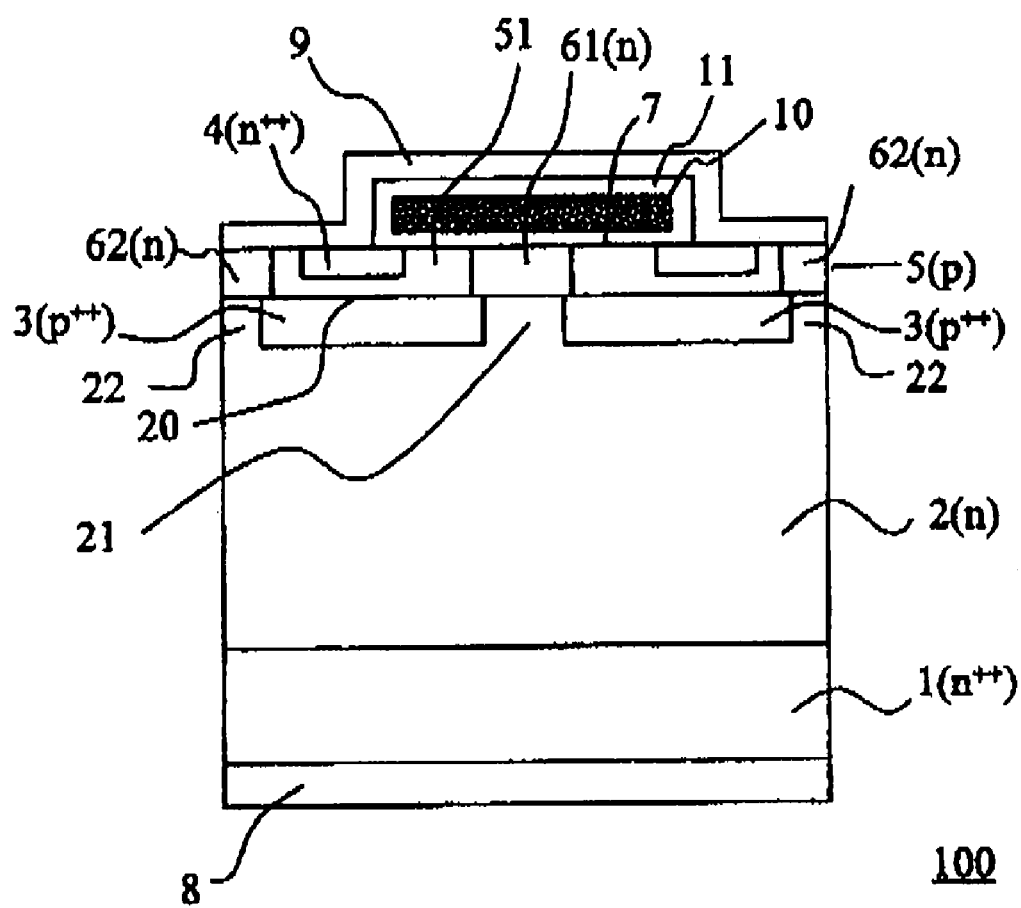
FIG. 1 This is a cross section of the unit cell of an SiC vertical MOSFET in the first embodiment of this invention.
Figure 2:
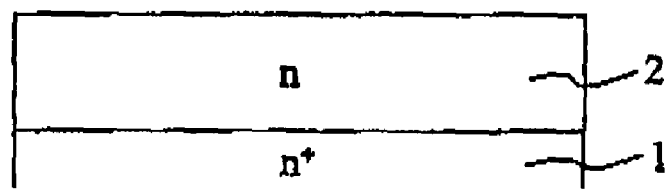
FIGS. 2(*a*) to 2(*f*) These are cross sections of the cell of the SiC vertical MOSFET of the first embodiment of this invention in the process of production.
Figure 2:
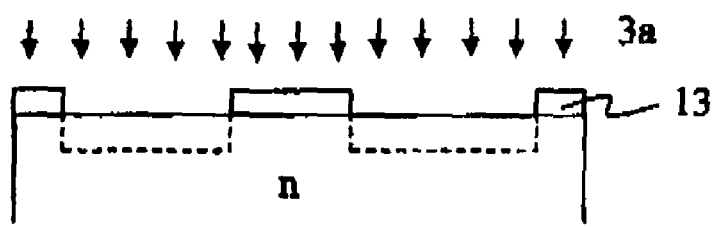
Figure 2:
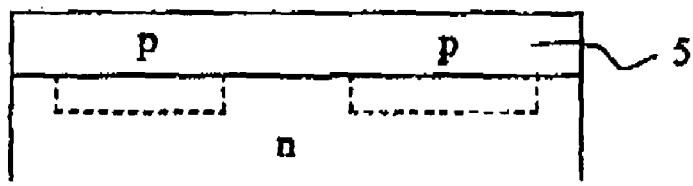
Figure 2:
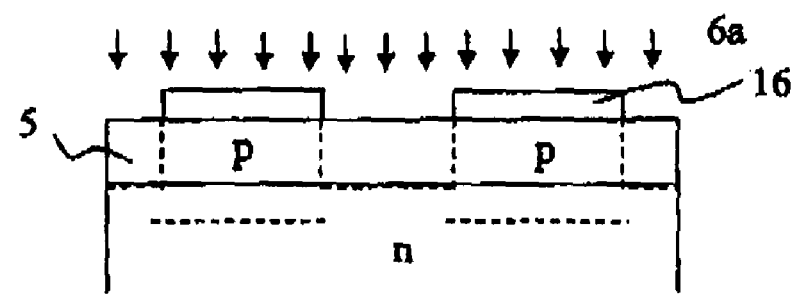
Figure 2:
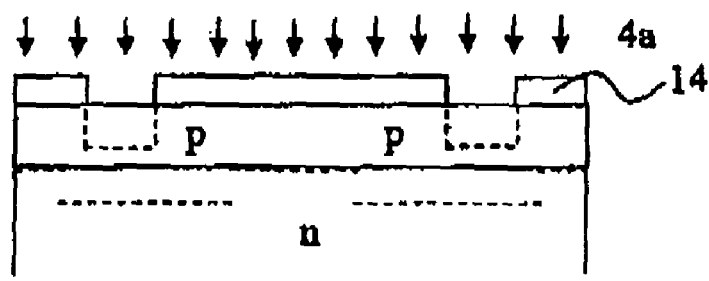
Figure 2:
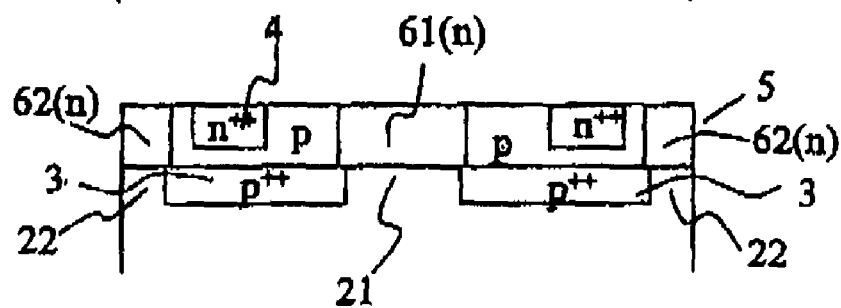
Figure 3:
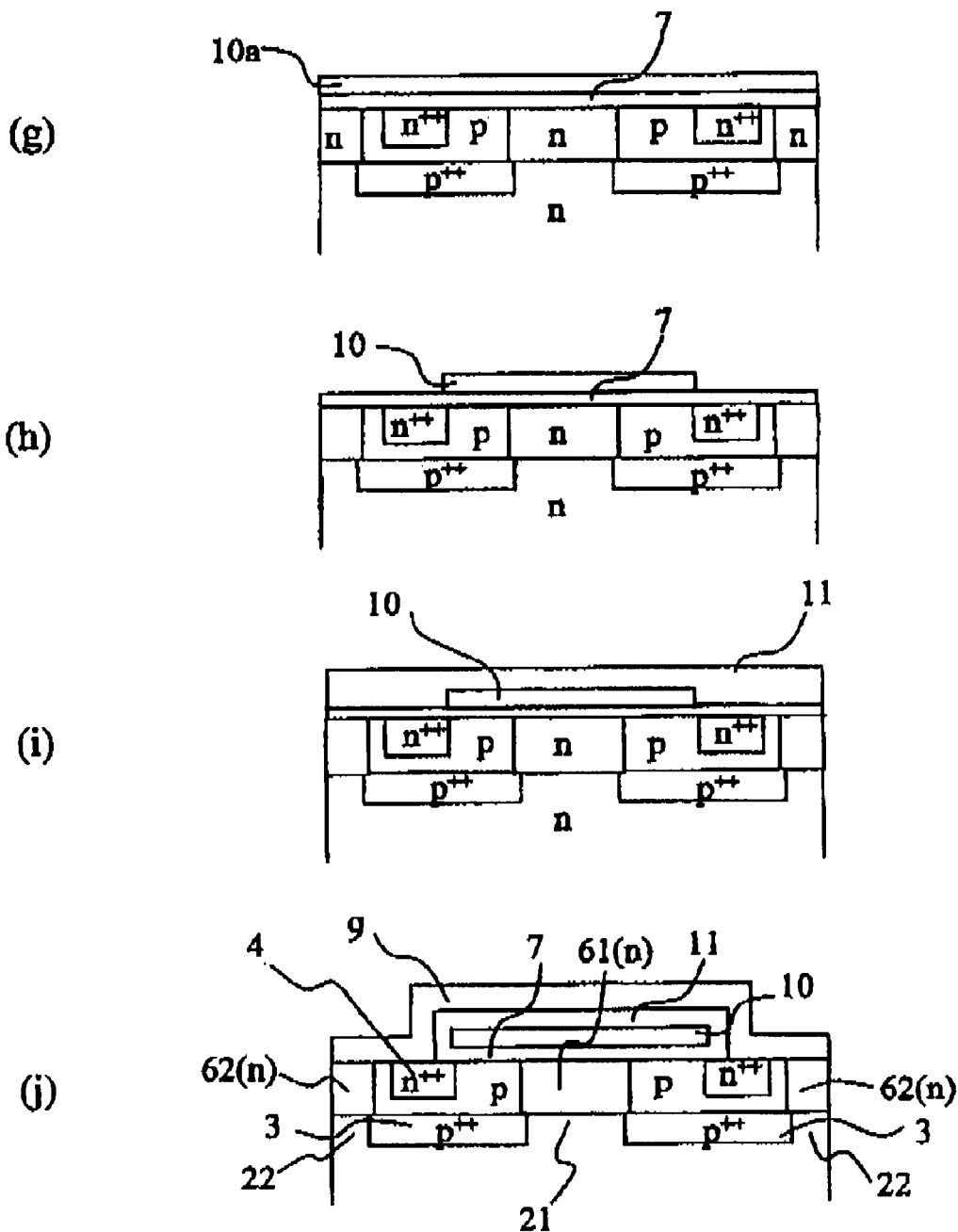
FIGS. 3(*g*) to 3(*j*) These are cross sections of the cell of the SiC vertical MOSFET of the first embodiment of this invention in the process of production.

1. High-density n-type substrate
2. Low-density n-type deposit film (drift layer)
3. High-density p-type well layer
3*a*. Ion implantation of p-type impurity
4. High-density n-type source layer
4*a*. Ion implantation of n-type impurity
5. Low-density p-type deposit film
6*a*. Ion implantation of p-type impurity 7. Gate insulating film
8. Drain electrode
9. Source electrode
10. Gate electrode
11. Interlayer insulating film
12. Schottky barrier metal
13. Ion implantation mask
14. Ion implantation mask
16. Ion implantation mask
20. Deposit film interface
21. First deficient part of high-density p-type layer
22. Second deficient pan of high-density p-type layer
51. Channel region
52. p-Type well region
61. First n-base layer (ion-implantation polarity-inversion layer)
62. Second n-base layer (ion-implantation polarity-inversion layer)
63. High-density n-type layer

BEST MODE FOR CARRYING OUT THE INVENTION

This invention will be described in detail below with reference to specific embodiment thereof.

First Embodiment

FIG. 1 is a cross section of the unit cell of an SiC vertical MOSFET in the first embodiment of this invention. In this structure, an n-type drift layer 2 doped with $5\times10^{15}$ cm$^{-3}$ of nitrogen and measuring about 15 μm in thickness is stacked on an n-type SiC substrate 1 doped with $5\times10^{18}$ cm$^{-3}$ of nitrogen and measuring about 300 μm in thickness. Throughout a depth of 0.5 μm from the surface thereof, a p-type layer 3 doped with $2\times10^{18}$ cm$^{-3}$ of aluminum is formed. The p-type layer 3 has a first deficient part 21 about 2 μm wide disposed in the central pan of the cell and second deficient parts 22 about 1.0 μm wide (½ of the width of the first deficient part 21) disposed on both sides of the cell. A low-density p-type deposit layer 5 doped with $5\times10^{15}$ cm$^{-3}$ of aluminum and measuring 0.5 μm in thickness is superposed on the surface of the p-type layer 3 and as well the surfaces of the first and second deficient parts 21 and 22 of the n-type drift layer 2. On the surface part of this p-type deposit layer 5, an n-type source layer 4 doped with about $1\times10^{20}$ cm$^{-3}$ of phosphorus is selectively formed. In the parts of the p-type deposit layer 5 neighboring the projections in the direction of thickness of the first deficient part 21 and the second deficient parts 22, a first n-type base region 61 and a second n-type base region 62, about 0.7 μm deep each, are severally formed so as to penetrate the p-type deposit layer 5 and reach the n-type drift layer 2 by causing the p-type deposit layer 5 doped to not less than $1\times10^{16}$ cm$^{-3}$ to be inverted to an n-type by ion implantation of nitrogen from the surface, A channel region 51 is formed in the surface layer of the p-type deposit layer 5 in the intermediate part between the n-type base region 61 and the n-type source layer 4. On the channel region 51 and in the parts on the surfaces of the first n-type base region 61 and the n-type source layer 4, a gate electrode 10 of polycrystalline silicon about 0.5 μm thick is disposed via a gate insulating film 7. On the gate electrode 10, in the surface part of the n-type source layer 4 and the part of the p-type deposit layer 5, a source electrode 9 of aluminum about 1 μm thick is formed in low resistance connection. The source electrode 9 creates a Schottky barrier between itself and the second n-type base layer 62. On the back surface of the high-density n-type substrate 1, a drain electrode 8 of nickel about 1 μm thick is connected in low resistance.

In the present embodiment, the built-in diode region is formed of the drain electrode 8, high-density n-type SiC substrate 1, low-density n-type drift layer 2, second deficient parts 22, second n-type base region 62 and source electrode 9. Further, the source electrode serves as a Schottky diode region because it gives rise to a Schottky barrier junction between itself and the second n-type base layer 62.

The basic switching motion of the MOSFET region of this SiC vertical MOSFET is similar to that of the ordinary Si vertical MOSFET. That is, in the on state, when a gate voltage exceeding the threshold voltage is applied to the gate electrode 10, electrons are induced on the surface of the p-type layer 5 to form the channel region 51. As a result, the n-type source layer 4 and the n-type drift layer 2 are interlinked with a conducting route for electrons that passes through the channel region 51, first n-type base region 61 and first partially deficient part 21 to allow flow of electric current from the drain electrode 8 to the source electrode 9. In this structure, since the channel region 51 is formed in the p-type deposit film 5 having a low density of $5\times10^{15}$ cm$^{-3}$, the film of the deposited part possesses sufficiently high crystalline quality, acquires high channel mobility of several tens of cm$^2$/Vs and decreases the on-resistance.

Then, in the off state, the voltage applied between the drain and source electrodes is inhibited by the p-n junction formed between the p-type layer 3 and the n-type drift layer 2 of high density. Until the first partially deficient part 21 of the p-type layer 3 is completely pinched off by the depletion layers extended from the p-n junctions on the opposite sides, however, the voltage is inhibited by the MOSFET part formed in the lateral direction with the n-type base region 61, p-type layer 3, n-type source layer 4, gate oxide film 7 and gate electrode 10. Since the partially deficient part 21 of the p-type layer 3 has a width of about 2 μm and the n-type drift layer 2 has a doping concentration of $5\times10^{15}$ cm$^{-3}$, the pinch-off voltage falls in the range of 30 to 50 V and the MOSFET part in the lateral direction can sufficiently withstand such low voltage. In the present embodiment, the interval between source and drain can obtain a stopping potential of 1500 V.

When a voltage of positive potential relative to the drain electrode 8 is applied to the source electrode 9, the mode wherein electric current flows to the built-in diode region arises. At this time, no p-n junction intervenes between the source electrode 10 and the drain electrode 8 and electric current flows through a Schottky barrier formed between the source electrode 9 and the second n-type base layer 62. Since the blocking-state voltage necessary for passage of electrons through the Schottky barrier is not more than 1.5 V, the voltage drop during the conduction of electric current to the diode can be decreased and the loss during the conduction of electric current to the diode can be made small as compared with the conventional structure wherein electrons flow through the p-n junction that necessitates a high blocking-state voltage of 2.5 V to 3.0 V. Further, the high-speed operation of the MOSFET will not be inhibited because the carrier for electric current is limited solely to electrons and minority carriers (positive holes) due to conduction of electric current are not accumulated in the n-type drift layer 2.

When voltage of negative potential relative to the drain electrode 8 is applied to the source electrode 9 and the adjoining MOSFET is in the off state, the built-in diode region must be in the state of stopping potential. Though the voltage applied between the drain and source electrodes is inhibited by the Schottky barrier formed between the n-type base region 62 and the source electrode 9 and the p-n junction formed between the high-density p-type layer 3 and n-type drift layer 2, the voltage is inhibited by the Schottky barrier till the second partially deficient part 22 of the p-type layer 3 is completely pinched off by the depletion layers extending from the p-n junctions on the opposite sides. Since the stopping potential of the built-in Schottky diode equals the stopping potential between the source and drain of the integrated MOSFET region, the present embodiment is capable of retaining a high voltage of 1500 V. At this time, so long as the width of the second partially deficient part 22 of the p-type layer 3 is about 2 µm nearly equally to that of the first partially deficient part 21, the pinch-off voltage falls in the range of 30 to 50 V and the Schottky barrier can sufficiently withstand such low voltage.

FIG. 2(a) through FIG. 2(f) and FIG. 3(g) through FIG. 3(j) are drawings depicting the process for fabricating the SiC vertical MOSFET in the first embodiment of this invention. They represent cross sections of a unit cell each. For a start, the low-density n-type drift layer 2 doped with $5 \times 10^{15}$ cm$^{-3}$ of nitrogen is deposited in a thickness of 15 µm on the high-density n-type substrate 1 (a). Then, for the purpose of forming the high-density p-type layer 3, an ion implantation of p-type impurity 3a is carried out by the use of a mask 13 (b). The mask 13 is formed by depositing an SiO$_2$ film about 1 µm thick on a surface in accordance with the low pressure CVD method and patterning this film by photolithography. The ion implantation of p-type impurity 3a is implemented by subjecting aluminum ions to the conditions, 500° C. in substrate temperature, 40 keV to 250 keV in acceleration energy and $2 \times 10^{18}$ cm$^{-3}$ in amount of implantation. After the mask is removed, the SiC low-density p-type deposit layer 5 doped with $5 \times 10^{15}$ cm$^{-3}$ of aluminum is deposited in a thickness of 0.5 µm (c). Thereafter, for the purpose of forming the first and second n-type base regions 61 and 62, an ion implantation of n-type impurity 6a is carried out by the use of a mask 16 (d). The ion implantation of p-type impurity 6a is implemented by subjecting nitrogen ions to the conditions, room temperature, 40 keV to 250 keV in acceleration energy and $1 \times 10^{16}$ cm$^{-3}$ in amount of implantation. By inverting the p-type deposit layer 5 to an n-type, the first n-type base region 61 and the second n-type base region 62 are formed severally to the extent of penetrating the p-type deposit layer 5 and reaching the n-type drift layer 2. After the mask 16 is removed, for the purpose of forming the n-type source layer 4, an ion implantation of n-type impurity 4a is carried out by the use of a mask 14 (e). The ion implantation of n-type impurity 6a is implemented by subjecting phosphorus ions to the conditions, 500° C. in substrate temperature, 40 keV to 120 keV in acceleration energy, and $2 \times 10^{20}$ cm$^{-3}$ in amount of implantation. After the mask 14 is removed, activating anneal is carried out in an atmosphere of argon at 1500° C. for 30 minutes (f). As a result, the p-type layer 3, n-type base regions 61 and 62 and n-type source layer 4 are formed. Subsequently, the gate insulating film 7 having a thickness of 40 nm is formed by thermal oxidation performed at 1200° C. for 140 minutes and a polycrystalline silicon film 10a having a thickness of 0.3 µm is deposited thereon by the low pressure CVD method (g). Then, the gate electrode 10 is formed in consequence of patterning by photolithography (h). Further, the interlayer insulating film 11 having a thickness of 0.5 µm is deposited on the surface by the low pressure CVD method (i). The interlayer insulating film 11 has a window inserted therein to form the source electrode 9 adapted to impart ohmic connection of low resistance to the surfaces of the n-type source layer 4 and p-type layer 5 and impart a Schottky barrier to the surface of the second n-type base region 62 (j). Finally, a device is completed by having the drain electrode 8 (not shown) connected in low resistance to the surface of the high-density n-type substrate 1.

The method of fabrication described above enables fabrication of an SiC vertical MOSFET that has a Schottky diode built therein and exhibits low on-resistance and high voltage without adding a new step to the process for fabricating adjoining MOSFET regions.

Second Embodiment

Figure 4:
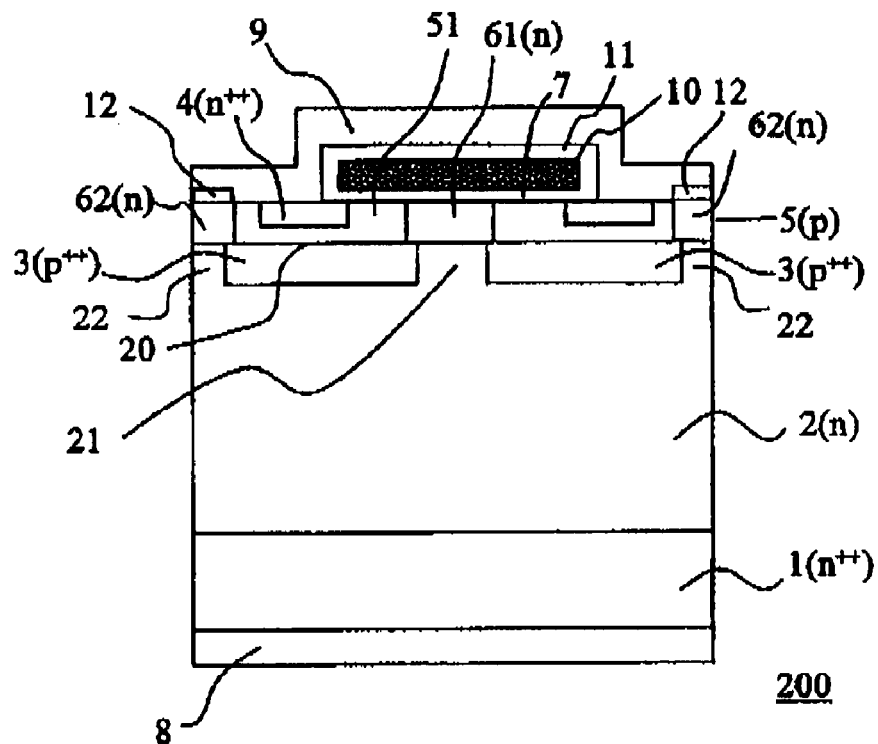
FIG. 4 This is a cross section of the unit cell of an SiC vertical MOSFET in the second embodiment of this invention.

FIG. 4 is a cross section of the unit cell of an SiC vertical MOSFET in the second embodiment of this invention. The same reference numerals used therein as the reference numerals denoting the component parts of the unit cell of the first embodiment shown in FIG. 1 denote the same component parts. This SiC vertical MOSFET is differentiated from the first embodiment of FIG. 1 at least in the point that a Schottky metal 12 different in material from the source electrode 9 is joined to the surface of the second n-type base region and the metal 12 is connected in low resistance to the source electrode 9.

By using as the Schottky metal a metal, such as titanium (Ti) or nickel (Ni), which has comparatively low Schottky barrier height, the voltage drop can be further cut and the elementary loss can be decreased during the conduction of electric current because the blocking-state voltage can be lowered below 1.0 V.

Third Embodiment

Figure 5:
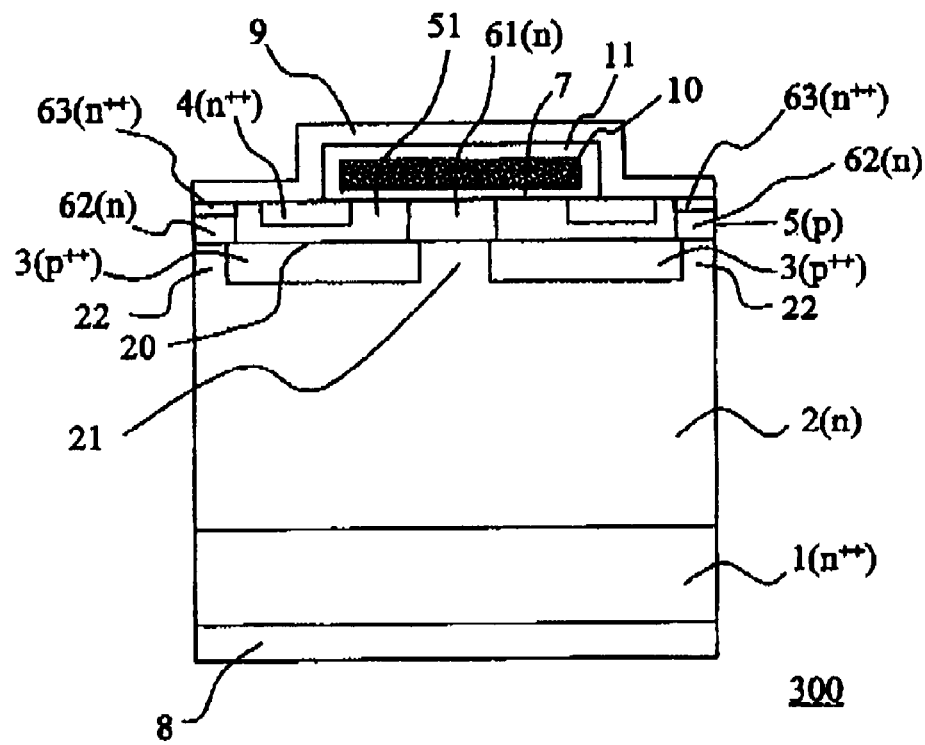
FIG. 5 This is a cross section of the unit cell of an SiC vertical MOSFET in the third embodiment of this invention.

FIG. 5 is a cross section of the SiC vertical MOSFET in the third embodiment of this invention. The same reference numerals used in the drawing as those of FIG. 1 denote the same component parts. The basic structure of this drawing equals that of FIG. 1 depicting the first embodiment except the point that an n-type layer 63 of high density is added to the surface part of the second n-type base region 62. The n-type layer 63 of high density is a layer that is obtained by forming the second n-type base region 62 through implantation of nitrogen ions and subsequently continuing the same implantation of nitrogen ions by the use of the same injection mask under the conditions, 40 keV to 120 keV in energy, about 0.2 µm in depth and about $3 \times 10^{17}$ cm$^{-3}$ in amount of implantation. By the supply of this layer, the loss during the current conduction to the diode can be decreased because the height of the Schottky barrier between the source electrode 9 and the n-type layer 63 is cut and the blocking-state voltage of the Schottky diode is further decreased. In this case, the increase of density in the semiconductor layer ordinarily results in augmenting the leakage current in the state of inhibition and lowering the stopping potential of the Schottky junction. In the present embodiment, however, the voltage applied between the drain and source electrodes is inhibited by the Schottky barrier junction and the p-n junction formed between the p-type layer 3 and n-type drift layer 2 of high density as described in the first embodiment. Owing to the fact that the second partially deficient part 22 of the p-type layer 3 is completely pinched off by the depletion layers extended from the p-n junctions on the opposite sides, the field strength exerted on the Schottky junction is limited to a low level and the leakage current in the Schottky junction is consequently cut. Further, when the width of the second partially deficient part 22 of the p-type layer 3 is about 2 µm nearly equal to the first partially deficient part 21, the voltage necessary for the pinch-off falls in the range of 30 to 50 V and the Schottky barrier is only required to withstand sufficiently such low voltage. Thus, the addition of the n-type layer 63 of high density will not result in lowering the stopping potential.

Fourth Embodiment

Figure 6:
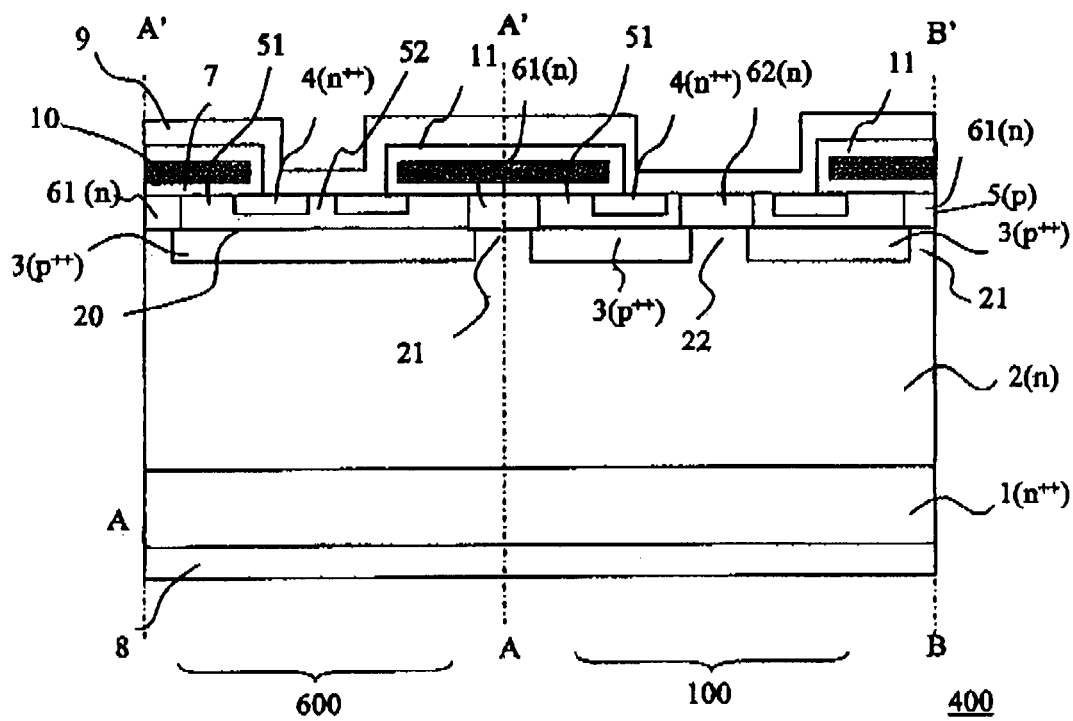
FIG. 6 This is a cross section of the alignment of unit cells of an SiC vertical MOSFET in the fourth embodiment of this invention.
Figure 8:
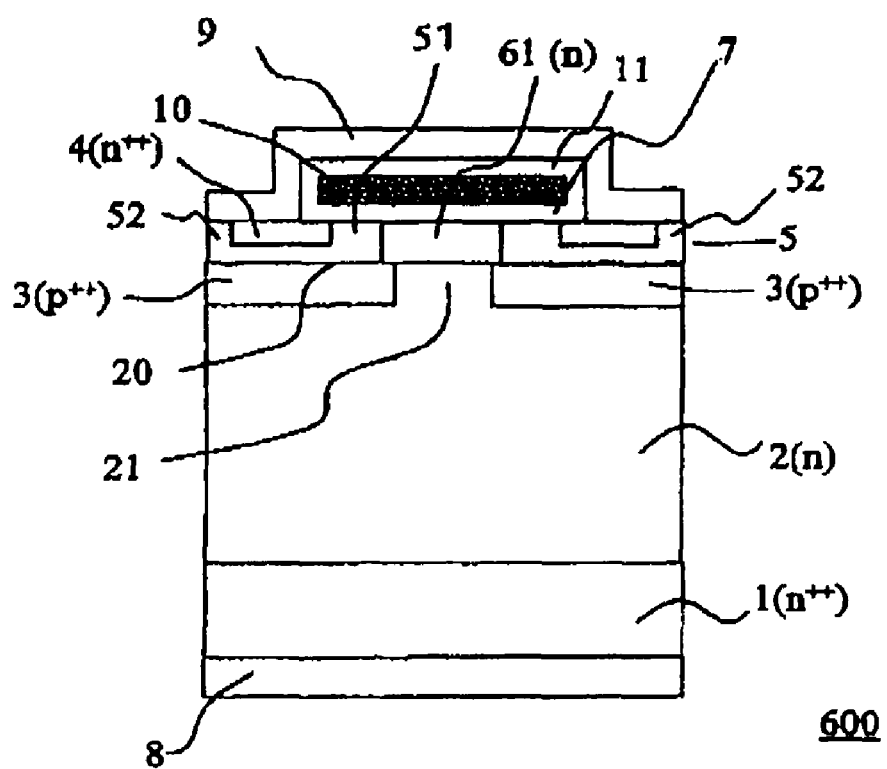
FIG. 8 This is a cross section of the unit cell of an SiC vertical MOSFET depicting a conventional example.

FIG. 6 is a cross section of part of the SiC vertical MOSFET in the fourth embodiment of this invention. The same reference numerals used in the drawing as those of FIG. 1 and FIG. 2 denote the same component parts. The embodiment depicted in FIG. 6 has two cells mounted in series. Specifically, a right half 100 equals the unit cell of the SiC vertical MOSFET in the first embodiment of this invention shown in FIG. 1 and a left half 600 corresponds to the unit cell of the SiC vertical MOSFET of the conventional structure that constitutes a prior application relative to this invention shown in FIG. 8. Generally, in a vertical power MOSFET that handles high electric power, an element handling large electric current is obtained by causing a multitude of unit cells nearly equal in structure to be aligned in series on the same semiconductor substrate in a main operating region thereof. In contrast, the present embodiment aligns two cells that are capable of being prepared by a substantially equal process of production and different in structure. The basic cell 100 that is illustrated in the first embodiment has a larger size than the basic cell 600 of the conventional structure by reflecting the addition of the Schottky region. For this reason, when solely the unit cells of the basic cell 100 are aligned within an element, the problem that the ratio of area occupied by the vertical MOSFET region will decrease and the on-resistance of the MOSFET will increase arises. The present embodiment has solved this problem. The present embodiment, therefore, does not necessarily limit the basic unit to a paired cell having two juxtaposed basic cells but requires incorporation of a cell containing as many Schottky diodes as needed in a cell of other structure prepared by a nearly equal process of fabrication. By this structure, the on-resistance of the MOSFET region can be prevented from being remarkably increased.

Fifth Embodiment

Figure 7:
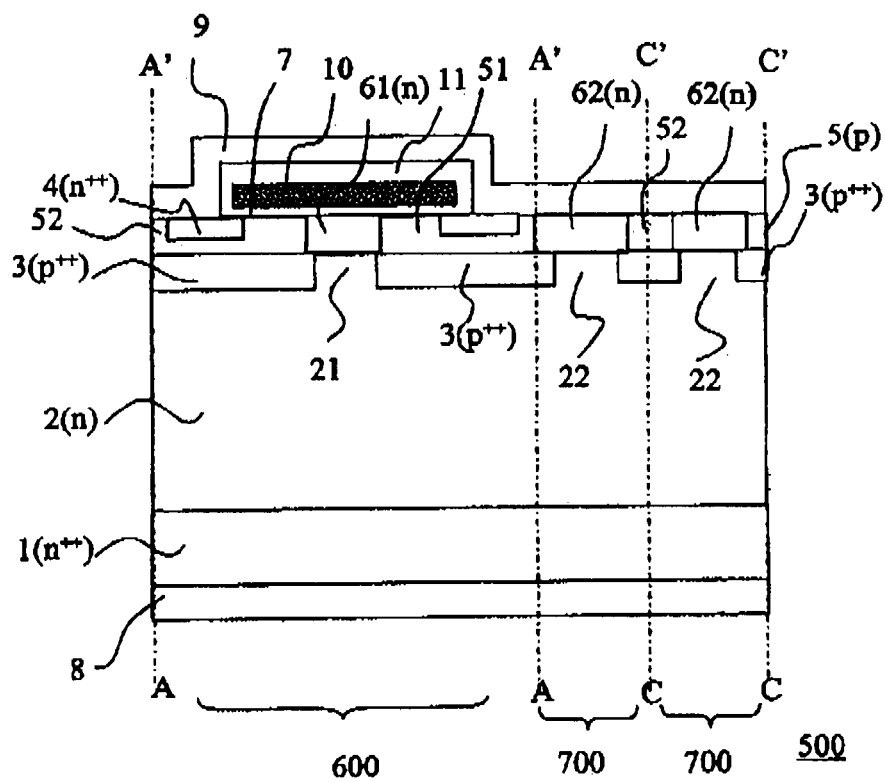
FIG. 7 This is a cross section of the alignment of unit cells of an SiC vertical MOSFET in the fifth embodiment of this invention.

FIG. 7 is a cross section of part of the SiC vertical MOSFET in the fifth embodiment of this invention. The same reference numerals used in the drawing as those of FIG. 1 and FIG. 2 denote the same component parts. The embodiment depicted in FIG. 7 has three cells mounted in series. Specifically, the cell 100 on the left side is the same unit cell as the SiC vertical MOSFET of the conventional structure that constitutes a prior application relative to this invention shown in FIG. 8 (having FIG. 8 drawn as shifted by a ½ cell) and the two other cells 700 that are identical in structure are diode base cells formed solely of the built-in Schottky diode regions of the unit cells of the SiC vertical MOSFET in the first embodiment of this invention shown in FIG. 1. The unit cells that are aligned in an element are not necessarily formed of a vertical MOSFET region and a diode region. In the present embodiment, the cell of the vertical MOSFET and the diode cell are laid in series. The three cells are not always required to have the juxtaposed structure of FIG. 7 as the basic unit, but are required to have as many Schottky diode cells as needed disposed in the series of MOSFET cells prepared by a nearly equal process of fabrication. This structure excels in respect that the spaces to be occupied by the Schottky diode region and the MOSFET region in the element can be freely selected. Also in this case, it is commendable to have a nearly uniform interval extend between the first deficient part 21 and the second deficient part 22.

The SiC vertical MOSFETs delineated in the aforementioned embodiments of this invention, though no specification is given as to the orientation of the crystal face of the SiC crystal substrate 1, are applicable to any of the $\{0001\}$ plane (called a silicon plane) substrate generally in wide adoption, $\{11\overline{2}0\}$ plane substrate, $\{000\overline{1}\}$ plane (called a carbon plane) substrate and substrates possessing surfaces parallel to the planes derived from adding a slight off-angle to those planes. The application to the $\{000\overline{1}\}$ plane (carbon plane) substrate and the plane substrate parallel to the plane derived from adding a slight off-angle has the nature of heightening the breakdown field strength in the neighborhood of the potential stopping junction and heightening the electron mobility in the channel region and proves most advantageous for obtaining a vertical MOSFET of low on-resistance.

While this invention has been described with reference to illustrated examples, it is not limited to the embodiments described above but may embrace other structures easily modified by persons skilled in the art within the scope of claims for patent.

The invention claimed is:

1. An SiC MOSFET using a unit cell as a component element, comprising:
    a first conducting-type silicon carbide substrate;
    a low-density first deposit film of first conducting-type silicon carbide formed on the first conducting-type silicon carbide substrate;
    a low-density second deposit film of second conducting-type silicon carbide formed on the low-density first deposit film;
    a first base region of the first conducting type, a second base region of the first conducting type and a gate region of the second conducting type formed selectively in the low-density second deposit film so that the first base region and the second base region penetrate the low-density second deposit film and contact directly the low-density first deposit film;
    a gate electrode disposed at least on a surface of the gate region of the second conducting type via a gate insulating film;
    a high density source region of the first conducting type formed selectively in the gate region of the second conducting type;
    a drain electrode connected at low resistance to a surface of the first conducting-type silicon carbide substrate;
    a high density gate layer of the second conducting type interposed between the low-density first deposit film and the low-density second deposit film, wherein the high density gate layer of the second conducting type is provided with a first partially deficient part and a second partially deficient part in regions defined by projections of the first base region and second base region of the first conducting type, respectively, and wherein the low-density second deposit film is enabled to contact directly the low-density first deposit film in the first partially deficient part and second partially deficient part; and
    a source electrode connected at a low resistance to surfaces of the high density source region and gate region and adapted to form a Schottky barrier on a surface of the second base region of first conducting type.

2. An SiC MOSFET according to claim 1, wherein the gate region of second conducting type selectively formed in the low-density second deposit film has a part contacting the gate insulating film and having a second conducting type impurity concentration of not more than $1 \times 10^{16}$ cm$^{-3}$.

3. An SiC MOSFET according to claim 1, wherein the high-density gate layer of the second conducting-type is formed in the low-density first deposit film.

4. An SiC MOSFET according to claim 1, wherein the first partially deficient part of the high density gate layer of the second conducting type has a width nearly equal to a width of the second partially deficient part.

5. An SiC MOSFET according to any one of claims 1 to 4, wherein the second base region and the source electrode of the first conducting type have a Schottky metal interposed therebetween and wherein the Schottky metal forms the Schottky barrier in conjunction with the second base region and causes a surface thereof to establish low resistance contact with the source electrode.

6. An SiC MOSFET according to claim 1, wherein the second base region of the first conducting type is provided in a surface part thereof with a high density layer of first conducting type in a region defined by a projection of the second partially deficient part in the low-density second deposit film.

7. An SiC MOSFET using the SiC MOSFET according to claim 1 as at least part of a component element.

8. A method for the fabrication of the SiC MOSFET according to claim 1, comprising:
    forming the high density gate layer of second conducting type partially on the low-density first deposit film;
    forming the low-density second deposit film of first conducting type on the high density gate layer of second conducting type and on the low-density first deposit film exposed in the first and second partially deficient parts; and
    performing selective ion implantation of a first conducting-type impurity from the surfaces of regions defined by the projections of the first and second partially deficient parts of the deposit film till the low-density second deposit film is reached, thereby forming the first and second base regions and of first conducting type.

9. A method for the fabrication of the SiC MOSFET according to claim 8, further comprising forming the high density gate layer of second conducting type on the surface of the low-density first deposit film by selective ion implantation of a second conducting type impurity and forming the low-density second deposit film thereon.

10. An SiC MOSFET incorporating a unit cell as a component element and comprising:
    a first conducting type SiC substrate;
    a low-density first deposit film made from first conducting type SiC and formed on the first conducting type SiC substrate;
    a low-density second deposit film made from second conducting type SiC and formed on the low-density first deposit film;
    a base region of the first conducting type and a gate region of the second conducting type selectively formed in the low-density second deposit film so that the base region penetrates the low-density second deposit film and contacts directly the low-density first deposit film;
    a drain electrode connected in low resistance to a surface of the first conducting type SiC substrate,
    a high density gate layer of the second conducting type interposed between the low-density first deposit film and the low-density second deposit film and provided with a partially deficient part in a region defined by projection of the base region of the first conducting type,
    said low-density second deposit film being allowed to directly contact the low-density first deposit film in the partially deficient part, and
    a source electrode connected in low resistance to a surface of the gate region of the second conducting type and allowed to form a Schottky barrier on a surface of the base region of the first conducting type.

11. An SiC MOSFET according to claim 10, wherein the first conducting type SiC substrate has a surface whose crystallographic plane index is a plane approximately parallel to the {0001} (carbon surface) plane.

* * * * *